United States Patent
Xiang et al.

[11] Patent Number: 5,994,191
[45] Date of Patent: Nov. 30, 1999

[54] ELEVATED SOURCE/DRAIN SALICIDE CMOS TECHNOLOGY

[75] Inventors: Qi Xiang, Santa Clara; Shekhar Pramanick, Fremont, both of Calif.

[73] Assignee: Advanced Micro Devices, Inc., Sunnyvale, Calif.

[21] Appl. No.: 09/112,156

[22] Filed: Jul. 9, 1998

[51] Int. Cl.[6] .................................. H01L 21/336
[52] U.S. Cl. .................. 438/300; 438/630; 438/648; 438/649; 148/DIG. 147; 148/305
[58] Field of Search .................... 438/630, 648, 438/649, 581, 682, 166, 300; 148/DIG. 147

[56] References Cited

U.S. PATENT DOCUMENTS

| | | |
|---|---|---|
| 4,835,112 | 5/1989 | Pfiester et al. . |
| 5,409,853 | 4/1995 | Yu . |
| 5,589,417 | 12/1996 | Jeng . |
| 5,744,395 | 4/1998 | Shue et al. . |
| 5,913,139 | 6/1999 | Hashimoto et al. . |

OTHER PUBLICATIONS

"Low Temperature Poly–Si Thin–Film Transistor Fabrication by Metal–Induced Lateral Crystallization"; Seok–Woon Lee and Seung–Ki Joo. IEEE Electron Device Letters, vol. 17, No.4, Apr. 1996, pp. 160–162.

*Primary Examiner*—Charles Bowers
*Assistant Examiner*—Scott J. Hawranek

[57] ABSTRACT

Low resistivity metal silicide layers are formed on a gate electrode and source/drain regions at an optimum thickness for reducing parasitic series resistances with an attendant consumption of silicon from the gate electrode and source/drain regions. Consumed silicon from the gate electrode and source/drain regions is then replaced employing metal induced crystallization, thereby avoiding a high leakage current. Embodiments include depositing a layer of amorphous silicon on the metal silicide layers and heating at a temperature of about 400° C. to about 600° C. initiating metal induced crystallization, thereby causing the metal silicide layers grow upwardly as silicon in the underlying gate electrode and source/drain regions is replaced.

20 Claims, 2 Drawing Sheets

ELEVATED SOURCE/DRAIN SALICIDE CMOS TECHNOLOGY

TECHNICAL FIELD

The present invention relates to semiconductor manufacturing, particularly to self-aligned silicide (salicide) technology. The present invention is particularly applicable to manufacturing ultra large scale integrated circuit (ULSI) systems having features in the deep-submicron range.

BACKGROUND ART

Deep-submicron scaling required for ULSI systems dominates design considerations in the microelectronics industry. As the gate electrode length is scaled down, the source and drain junctions must be scaled down accordingly, to suppress the so-called short channel effects (SCE) which degrade performance of scale-downed devices. A major problem related to complementary metal oxide silicon (CMOS) scaling is the undesirable increase in parasitic resistance. As the source/drain junction depth ($X_j$) and polycrystalline silicon line width are scaled into the deep-submicron range, parasitic series resistances of the source/drain diffusion layers and polycrystalline silicon gate electrodes increase. A conventional solution to the problem of increased parasitic series resistances of the source/drain diffusion layers and the polycrystalline silicon gate electrodes involves salicide technology which comprises forming a layer of titanium disilicide ($TiSi_2$) on the source/drain regions and gate electrode.

Conventional salicide technology employing $TiSi_2$ for reducing parasitic series resistances has proven problematic, particularly as design rules plunge into the deep-submicron range, e.g., about 0.18 microns and under. For example, in forming a thin $TiSi_2$ layer, silicide agglomeration occurs during silicide annealing to effect a phase change from the high resistivity C49 form to the low resistivity C54 form. Such agglomeration further increases the sheet resistance of the silicide film. Moreover, the formation of a thick silicide layer causes a high junction leakage current and low reliability, particularly when forming ultra shallow junctions, e.g., at an $X_j$ of less than about 800Å. The formation of a thick silicide consumes crystalline silicon from the underlying semiconductor substrate such that the interface of the thick silicide layer and silicon substrate approaches and even shorts the ultra-shallow junction, thereby generating a high junction leakage current.

Another problem attendant upon conventional $TiSi_2$ technology is the well-known increase in sheet resistance as the line width narrows. The parasitic series resistances of source/drain regions and gate electrodes are a major cause of device performance degradation and are emerging as one of the severest impediments to device scaling.

In copending application Ser. No. 09/106,769, filed on Jun. 30, 1998 (our Docket No. 50100-629; 1033-661), elevated salicide methodology is disclosed comprising selectively depositing a metal, such as nickel, on source/drain regions and the gate electrode. A layer of amorphous silicon is then deposited on the metal followed by heating at a sufficiently low temperature such that the metal reacts with the overlying amorphous silicon, thereby growing upwardly without consumption of silicon from the underlying substrate and gate electrode.

There exists a need for salicide technology which enables a reduction in the parasitic sheet resistances without generating a high leakage current. There exists a particular need for salicide methodology which avoids the generation of a high leakage current in semiconductor devices having a design rule in the deep-submicron range, e.g., a design rule less than about 0.18 microns.

DISCLOSURE OF THE INVENTION

An advantage of the present invention is a method of manufacturing a semiconductor device having an elevated salicide structure exhibiting a reduction in parasitic sheet resistances without generating a high leakage current.

Another advantage of the present invention is a method of manufacturing a semiconductor device having a design rule less than about 0.18 microns with source/drain regions having an ultra shallow junction less than about 800Å utilizing an elevated salicide technology avoiding the generation of high leakage current while reducing parasitic series resistances.

Additional advantages and other features of the present invention will be set forth in part in the description which follows, and in part will become apparent to those having ordinary skill in the art upon examination of the following or may be learned by practice of the present invention. The advantages of the present invention may be realized and attained as particularly pointed out in the appended claims.

According to the present invention, the foregoing and other objects are achieved in part by a method of manufacturing a semiconductor device, the method comprising: forming a structure comprising: a crystalline silicon substrate having a main surface; source/drain region extending from the main surface into the substrate with a channel region therebetween; a gate dielectric layer on the substrate over the channel region; a polycrystalline silicon gate electrode, having side surfaces and a first height defined between a first upper surface and a lower surface, on the gate dielectric layer; and a dielectric sidewall spacer on each side surface of the gate electrode, leaving a portion of each source/drain regions exposed; forming a metal silicide layer: on the first upper surface of the gate electrode, thereby reducing the first height of the gate electrode to a second height defined between a second upper surface and the lower surface; and on each exposed source/drain region extending below the main surface into each source/drain region; depositing a layer of amorphous silicon on the metal silicide layers and on the sidewall spacers; and heating to cause metal induced crystallization, thereby: crystallizing the amorphous silicon layers on the source/drain regions into monocrystalline silicon while the metal silicide layers on the source/drain regions move upwardly such that they do not extend below the main surface; and crystallizing the amorphous silicon layer on the second upper surface gate electrode into polycrystalline silicon while the metal silicide layer on the gate electrode moves upwardly such that it does not extend below the first upper surface of the gate electrode.

Another aspect of the present invention is a method of manufacturing a semiconductor device, the method comprising: forming a structure comprising: a crystalline silicon substrate having a main surface; source/drain regions extending from the main surface into the substrate with a channel region therebetween; a gate dielectric layer on the substrate over the channel region; a polycrystalline silicon gate electrode, having side surfaces and a first height defined between a first upper surface and a lower surface on the gate dielectric layer; and a dielectric sidewall spacer on each side surface of the gate electrode leaving a portion of each source/drain region exposed; forming a metal silicide layer, comprising titanium silicide, nickel silicide or cobalt silicide: on and extending below the first upper surface of the gate electrode, thereby reducing the first height of the gate electrode to a second height defined between a second upper surface and the lower surface; and on each exposed source/drain region extending below the main surface into each source/drain region, wherein silicon in the gate electrode and in each source/drain region is consumed during metal silicide formation; and replacing the consumed silicon in the gate electrode and source/drain regions while moving the metal silicide layers upwardly.

Additional advantages of the present invention will become readily apparent to those skilled in the art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION THE INVENTION

Figure 1:
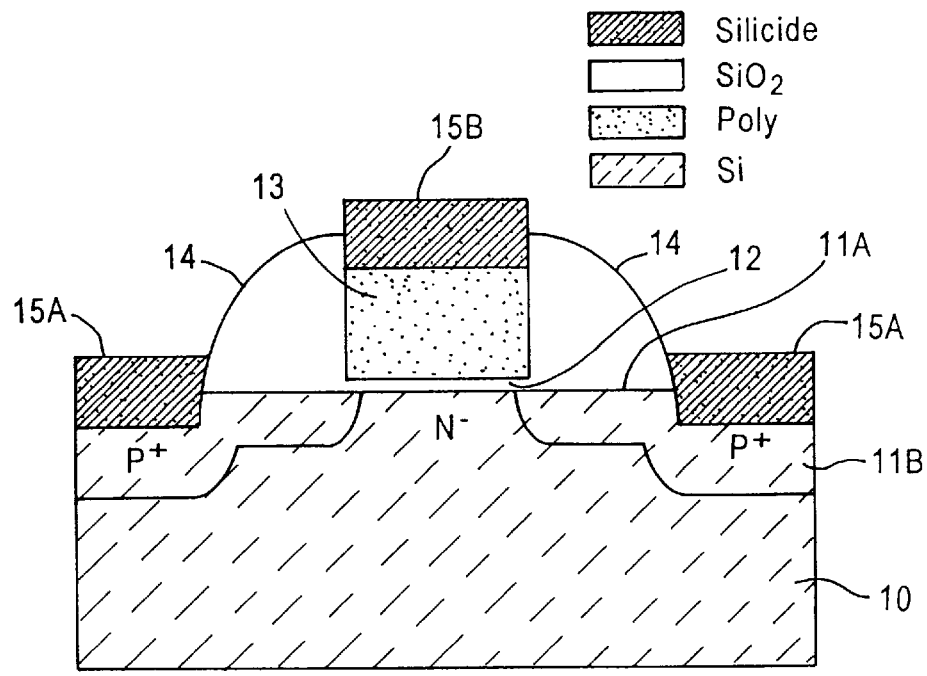
FIGS. 1–4 schematically illustrate sequential phases in accordance with an embodiment of the present invention.

The present invention addresses and solves problems attendant upon conventional salicide technology for reducing parasitic series resistances. Conventional salicide methodology comprises forming a layer of $TiSi_2$ on the source/drain diffusion layers and on the polycrystalline silicon gate electrode, to prevent an increase in the parasitic series resistances due to scaling down of the source/drain junction depth and polycrystalline silicon line width. However, the formation of a sufficiently thick $TiSi_2$ layer on the source/drain regions to reduce parasitic series resistances generates a leakage current, in that the interfaces of the $TiSi_2$ layers on the source/drain regions and silicon substrate approaches and frequently overlaps the shallow junction causing an increase in junction leakage current. If a thin $TiSi_2$ layer is employed, a high sheet resistance would result. Moreover, $TiSi_2$ undergoes agglomeration upon annealing from the high resistivity C49 phase to the low resistivity C54 phase, thereby further increasing sheet resistance. $TiSi_2$ also increases in sheet resistance as the gate electrode line width is narrowed.

The present invention addresses and solves such problems by providing an elevated salicide technology for source/drain regions and gate electrodes which effectively lowers the parasitic series resistances without encountering the above-discussed problems attendant upon conventional $TiSi_2$ salicide technology. In accordance with various embodiments of the present invention, a silicide layer is initially formed on the source/drain regions and gate electrode, resulting in undesirable consumption of silicon from the underlying source/drain regions and gate electrode. However, in accordance with the present invention, all or substantially all of the silicon consumed in the substrate and gate electrode is replaced, thereby significantly improving the junction leakage and reliability of ultra-shallow junctions.

The present invention enjoys utility in manufacturing any of various types of semiconductor devices, particularly advanced deep-submicron CMOS devices, such as 0.1 micron devices with ultra-shallow junctions, such as less than about 800Å, e.g., even less than about 500Å. The present invention enables the formation of metal silicide layers on gate electrodes and source/drain regions having a thickness of about 400Å to about 1000Å.

The present invention enables the formation of metal silicide layers on gate electrodes and source/drain regions for ultra-shallow source/drain junctions and deep-submicron polycrystalline silicon gate electrodes, such that no or virtually no silicon from the substrate or gate electrode is ultimately consumed in forming the metal silicide layers. In accordance with embodiments of the present invention, the phenomenon known as metal induced crystallization (MIC) is employed to obtain a self-aligned selective crystallization to form elevated source/drain regions as well as gate electrodes. Thus, in accordance with the embodiments of the present invention, MIC technology is employed to replace or replenish silicon consumed by metal silicide formation in source/drain regions and in gate electrodes. By replenishing the silicon consumed by metal silicide formation in source/drain regions, junction leakage is prevented with an attendant improvement in the reliability of ultra-shallow junctions. Accordingly, the present invention enjoys industrial applicability in advanced deep submicron CMOS devices, such as sub-0.1 $\mu$m devices having ultra-shallow junctions of 800Å and under, e.g., 500Å and under.

Metal induced lateral crystallization has previously been employed in fabricating a thin film transistor. See, Lee et al., "Low Temperature Poly-Si Thin-Film Transistor Fabrication by Metal-Induced Lateral Crystallization", IEEE Electron Device Letters, Vol. 17, No. 4, April 1996, pages 160–162. The present invention, however, employs MIC to achieve self-aligned selective crystallization in forming elevated source/drain regions and gate electrodes.

The MIC technology underlying the present invention is based upon the propensity of various metal silicides to enhance crystallization of amorphous silicon resulting in crystallization at a temperature below the temperature normally required for crystallization of amorphous silicon by solid-phase crystallization (SPC). Typically, the SPC of amorphous silicon begins at about 600° C. During thermal treatment, the metal silicide acts as a seed crystal for crystallizing amorphous silicon. During crystallization of amorphous silicon, the metal silicide layers move upwardly maintaining a position on the growing front.

In accordance with embodiments of the present invention, a semiconductor transistor structure is formed in a conventional manner, with source/drain regions spaced apart by a channel region in a semiconductor substrate, with a gate electrode over the channel region with a gate dielectric layer therebetween. Metal silicide layers are formed on the source/drain regions and a gate electrode in a conventional manner, thereby undesirably consuming silicon in the source/drain regions and gate electrodes. Consequently, the distance between the metal silicide/silicon interface and the source/drain junctions is narrowed and sometimes overlapped, thereby generating a high leakage current and low reliability.

The present invention departs from such conventional practices by depositing a layer of amorphous silicon on the metal silicide layers on the source/drain regions and on the metal silicide layer on the gate electrode, as well as on the sidewall spacers of the gate electrode. Heating is then conducted to initiate MIC, thereby crystallizing the amorphous silicon layer on the source/drain regions into monocrystalline silicon while the metal silicide layers on the source/drain regions move upwardly up to and even above the main surface of the semiconductor substrate, thereby replacing silicon consumed by metal silicide formation. In addition, during heating, the amorphous silicon layer on the upper surface of the gate electrode is crystallized into polycrystalline while the metal silicide layer moves upwardly, thereby replacing silicon of the gate electrode consumed during metal silicide formation.

The metal silicide employed in the present invention can be any metal silicide conventionally employed in the manufacture of semiconductor devices, such as nickel silicide, cobalt silicide or titanium silicide, with nickel silicide and cobalt silicide particularly advantageous in that they exhibit better sheet resistance for a narrow line width. In accordance with the present invention, the substrate typically comprises crystalline silicon, e.g., monocrystalline silicon. The substrate can either be a p-type substrate or an n-type substrate, with the source/drain regions having a conductivity type opposite to that of the substrate.

In accordance with the present invention, the sidewall spacers on the gate electrode can comprise silicon dioxide, silicon nitride, or a composite of silicon dioxide and silicon nitride. Typically, the source/drain regions comprise a shallow extension region under the sidewall spacer and a heavily doped region exposed on the main surface of the semiconductor substrate on which the metal silicide layer is formed. Reliable ultra-shallow source/drain junctions formed in accordance with the present invention have a junction depth ($X_j$) of 800Å and under, e.g., 500Å and under.

Embodiments of the present invention include depositing the layer of amorphous silicon by any of various conventional techniques. It was found particularly suitable to deposit the amorphous silicon layer by sputtering, evaporation or chemical vapor deposition suitable temperature, e.g., of about 180° C. to less than about 280° C. to a thickness of about 200Å to about 1000Å. Metal induced crystallization is conducted at a temperature of about 400° C. to about 600° C., e.g., about 500° C., after deposition of the amorphous silicon layer. Given the objectives of the present invention, optimum parameters, such as temperature and time, can be easily determined. For example, the optimum MIC parameters are typically geared to the completion of vertical MIC amorphous silicon, depending upon the growth rate of MIC and the thickness of the amorphous silicon layer. As a result of MIC, the amorphous silicon layers on the source/drain regions are crystallized into monocrystalline silicon and the amorphous silicon layer on the gate electrode is crystallized into polycrystalline silicon, while the metal silicide layers move upwardly.

Subsequent to MIC, the remaining amorphous silicon on the sidewall spacers is selectively removed, as by wet etching, conveniently employing the metal silicide on the source/drain regions and gate electrode as a mask to protect the source/drain silicon and gate electrode silicon from etching. Subsequently, process flow is performed in a conventional manner.

Sequential phases of a method in accordance with an embodiment of the present invention are schematically illustrated in FIGS. 1–4, wherein similar reference numerals denote similar features. Adverting to FIG. 1, a conventional transistor structure is formed in a conventional manner and comprises substrate 10 doped with an n-type impurity, and source/drain regions comprising a shallow extension region 11A and a heavily doped (HD) region 11B doped with a p-type impurity. The source/drain regions are formed in a conventional manner as, for example, by forming gate electrode layer 13 on semiconductor substrate 10 with gate dielectric layer 12, e.g., a gate oxide such as silicon dioxide, therebetween. Using the gate electrode as a mask, shallow extension regions 11A are formed. Dielectric sidewall spacers 14 are then formed on the side surfaces of gate electrode 13. Dielectric sidewall spacers can comprise any suitable dielectric material, such as silicon dioxide, silicon nitride or a composite of silicon dioxide and silicon nitride. Ion implantation is then conducted, using the gate electrode 13 and sidewall spacers 14 as a mask, to form HD regions 11B.

With continued reference to FIG. 1, metal silicide layers 15A are formed on the source/drain regions and metal silicide layer 15B is formed on gate electrode 13, in accordance with conventional techniques. For example, a layer of titanium, nickel or cobalt is deposited and heated to effect reaction between the metal and underlying silicon to form the metal silicide layers 15A and 15B. During metal silicide formation, silicon from the underlying gate electrode 13 and silicon from the underlying source/drain regions is consumed, thereby reducing the distance between the metal silicide/silicon interface and the source/drain junction depth. Heating to form the metal silicide is typically conducted in two stages. An initial stage is conducted to form a high resistance metal silicide phase, after which unreacted metal on the sidewall spacers 14 is selectively removed. Subsequently, a second heating stage is conducted to convert the high resistance metal silicide phase to the low resistance metal silicide phase. Thus, the structure depicted in FIG. 1 illustrates the result of conventional practices and the point at which the present invention departs from conventional practices.

Figure 2:
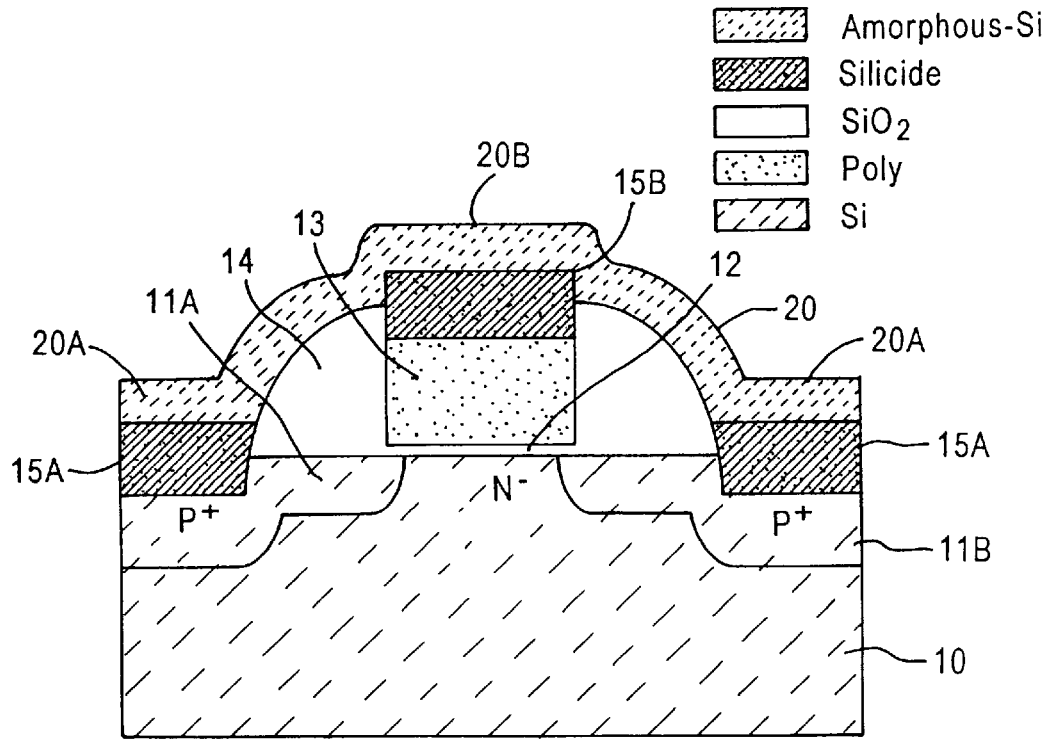

Adverting to FIG. 2, a layer of amorphous silicon 20 is then deposited on metal silicide layers 15A and 15B and on sidewall spacers 14. The portions of amorphous silicon layer 20 deposited over the source/drain regions and gate electrode are designated by reference numerals 20A and 20B, respectively. It has been found advantageous to deposit amorphous silicon layer 20 by physical vapor deposition, e.g., sputtering, or low temperature chemical vapor deposition (LTCVD), at a temperature less than about 280° C.

Subsequent to depositing amorphous silicon layer 20, heating is conducted at a temperature of about 400° C. to about 600° C., e.g., about 500° C., to cause MIC. During MIC, portions of the amorphous silicon layer 20A (FIG. 2) on the metal silicide layers 15A formed on the source/drain regions are crystallized into monocrystalline silicon, while the portion of amorphous silicon 20B (FIG. 2) on the gate electrode is crystallized into polycrystalline silicon. In addition, during MIC, the metal silicide layers move upwardly above the upper surfaces of the source/drain regions and gate electrode. Consequently, as MIC proceeds, the metal silicide remains at the growing front, thereby forming self-aligned selective crystallization while silicon in the underlying source/drain region and gate electrode is replenished.

Figure 3:
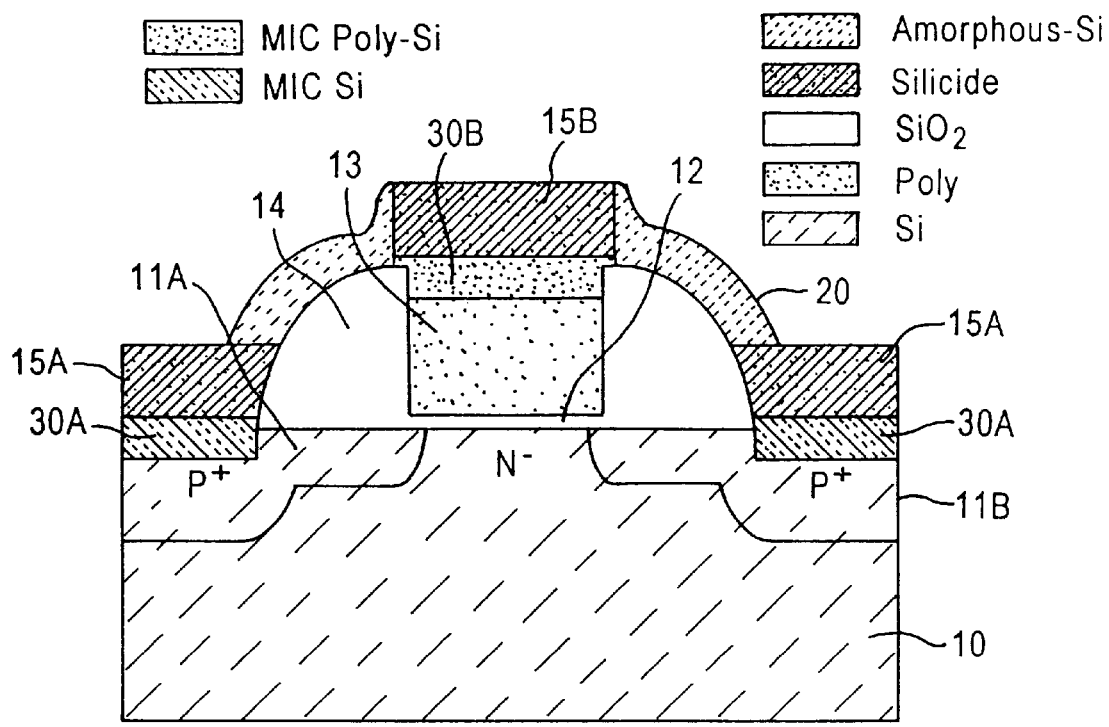

As shown in FIG. 3, after heating, MIC monocrystalline silicon regions 30A are formed in the source/drain regions replenishing and even exceeding the original amount of silicon consumed during original formation of metal silicide layers 15A. In addition, as also illustrated in FIG. 3, after heating, MIC polycrystalline silicon region 30B is formed in gate electrode 13, thereby replenishing and even exceeding the amount of silicon consumed in originally forming metal silicide layer 15B.

Figure 4:
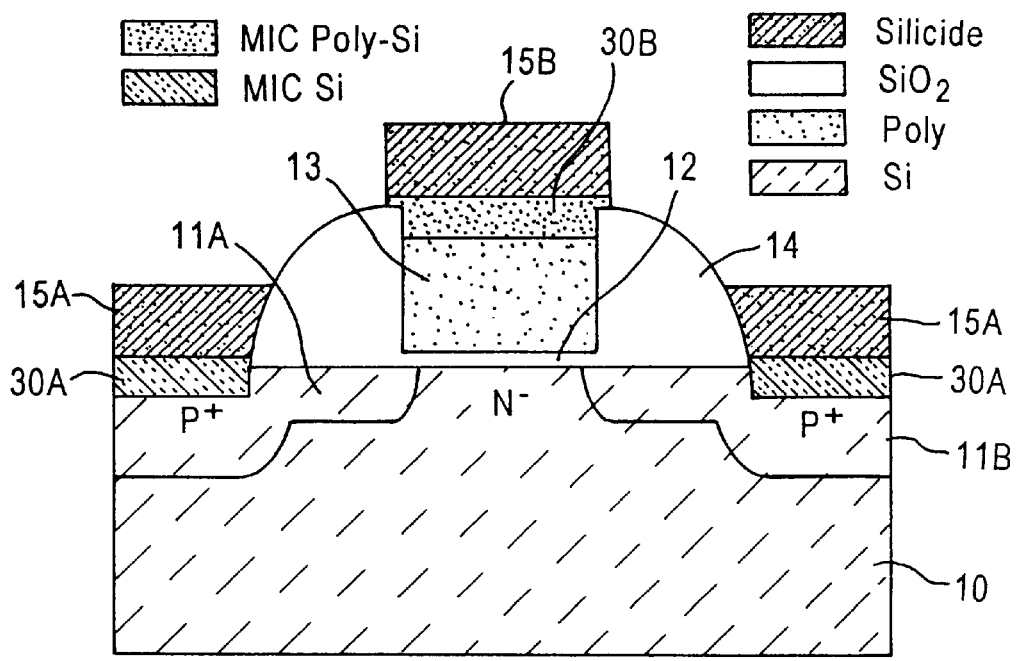

Subsequent to MIC, the remaining portions of amorphous silicon layer 20 are removed from sidewall spacers 14, as by wet etching, employing metal silicide layers on the source/drain regions and gate electrode to protect underlying silicon during etching, as shown in FIG. 4. The process flow is then resumed in a conventional manner.

The present invention strategically employs MIC subsequent to metal silicide layer formation to replace silicon consumed from the source/drain regions and gate electrodes during metal silicide formation. Thus, the present invention enables the manufacture of semiconductor devices having an $X_j$ of about 800Å and under, e.g., about 500Å and under, without encountering junction leakage, thereby increasing device reliability, notwithstanding formation of metal silicide layers at a sufficient thickness to avoid parasitic series resistances.

The present invention is applicable to the manufacture of various types of semiconductor devices, particularly semiconductor devices having a design rule less than about 0.18 microns. Advantageously, the process flow of the present invention is totally compatible with current CMOS technology and, hence, can be integrated into existing processing facilities without new or substantial modification of existing processing equipment, thereby minimizing manufacturing costs while increasing output and reliability. The present invention also simplifies process flow by eliminating the requirement for relatively deep source/drain junctions to compensate for optimizing the thickness of metal silicide layers to avoid transistor parasitic resistances. Thus, the present invention enables reduction of transistor parasitic resistances while enabling the formation of ultra-shallow source/drain junctions without junction leakage.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising:
    forming a structure comprising:
        a crystalline silicon substrate having a main surface;
        source/drain regions extending from the main surface into the substrate with a channel region therebetween;
        a gate dielectric layer on the substrate over the channel region;
        a polycrystalline silicon gate electrode, having side surfaces and a first height defined between a first upper surface and a lower surface, on the gate dielectric layer; and
        a dielectric sidewall spacer on each side surface of the gate electrode, leaving a portion of each source/drain region exposed;
    forming a metal silicide layer: on the first upper surface of the gate electrode, thereby reducing the first height of the gate electrode to a second height defined between a second upper surface and the lower surface; and on each exposed source/drain region extending below the main surface into each source/drain region;
    depositing a layer of amorphous silicon on the metal silicide layers and on the sidewall spacers; and
    heating to cause metal induced crystallization, thereby:
        crystallizing the amorphous silicon layers on the source/drain regions while the metal silicide layers on the source/drain regions move upwardly such that the metal silicide layers do not extend below the main surface; and
        crystallizing the amorphous silicon layer on the second upper surface gate electrode while the metal silicide layer on the gate electrode moves upwardly such that it does not extend below the first upper surface of the gate electrode.

2. The method according to claim 1, wherein;
    silicon in each source/drain region and gate electrode is consumed during formation of the metal silicide layers; and
    the consumed silicon in the source/drain region gate electrode is substantially restored during metal induced crystallization.

3. The method according to claim 2, comprising heating to cause the metal induced crystallization to crystallize:
    the amorphous silicon layer on the source/drain regions into monocrystalline silicon; and
    the amorphous silicon layer on the gate electrode into polycrystalline silicon.

4. The method according to claim 3, comprising replacing the consumed silicon by:
    depositing a layer of amorphous silicon on the metal silicide layers and on the sidewall spacers;
    heating at a temperature of about 400° C. to about 600° C. to cause metal induced crystallization, thereby:
        crystallizing the amorphous silicon layers on the source/drain regions into monocrystalline silicon while the metal silicide layers on the source/drain regions move upwardly such that the metal silicide layers do not extend below the main surface; and
        crystallizing the amorphous silicon layer on the gate electrode into polycrystalline silicon while the metal silicide layer on the gate electrode moves upwardly such that the metal silicide layer does not extend below the first upper surface of the gate electrode; and
    removing remaining amorphous silicon on the sidewall spacers by wet etching employing the metal silicide on the gate electrode and source/drain regions as a mask to protect the gate electrode and source/drain regions, respectively, from etching.

5. The method according to claim 4, comprising depositing the amorphous silicon at a temperature of about 180° C. to less than about 280° C.

6. The method according to claim 4, wherein each source/drain region comprises a shallow extension region under the sidewall spacer and a heavily doped region constituting the exposed portion.

7. The method according to claim 1, further comprising removing remaining amorphous silicon on the sidewall spacers.

8. The method according to claim 7, comprising removing the amorphous silicon by wet etching employing the metal silicide layer on a gate electrode and the metal silicide layer on the source/drain regions as a mask to protect the gate electrode and source/drain regions, respectively, from etching.

9. The method according to claim 1, comprising heating at a temperature of about 400° C. to about 600° C. to cause the metal induced crystallization.

10. The method according to claim 1, comprising depositing the layer of amorphous silicon at a temperature of about 180° C. to less than about 280° C. by physical vapor deposition or chemical vapor deposition.

11. The method according to claim 1, comprising depositing the amorphous silicon layer at a thickness of about 200Å to about 1000Å.

12. The method according to claim 1, wherein the metal silicide comprises titanium silicide, nickel silicide or cobalt silicide.

13. The method according to claim 12, wherein the metal silicide comprises nickel silicide or cobalt silicide.

14. the method according to claim 1, wherein each sidewall spacer comprises silicon dioxide, silicon nitride, or a composite of silicon dioxide and silicon nitride.

15. The method according to claim 1, wherein each source/drain region comprises a shallow extension region under the sidewall spacer and a heavily doped region constituting the exposed portion.

16. The method according to claim 1, wherein each source/drain region has a junction depth less than about 800Å.

17. A method of manufacturing a semiconductor device, the method comprising:
  forming a structure comprising:
    a crystalline silicon substrate having a main surface;
    source/drain regions extending from the main surface into the substrate with a channel region therebetween;
    a gate dielectric layer on the substrate over the channel region;
    a polycrystalline silicon gate electrode, having side surfaces and a first height defined between a first upper surface and a lower surface, on the gate dielectric layer; and
    a dielectric sidewall spacer on each side surface of the gate electrode leaving a portion of each source/drain region exposed;
  forming a metal silicide layer, comprising titanium silicide, nickel silicide or cobalt silicide: on and extending below the first upper surface of the gate electrode thereby reducing the first height of the gate electrode to a second height defined between a second upper surface and the lower surface; and on each exposed source/drain region extending below the main surface into each source/drain region, wherein silicon in the gate electrode and in each source/drain region is consumed during metal silicide formation; and
  replacing the consumed silicon in the gate electrode and source/drain regions while moving the metal silicide layers upwardly.

18. The method according to claim 17, wherein each sidewall spacer comprises a silicon, dioxide, silicon nitride, or a composite of silicon dioxide and silicon nitride.

19. The method according to claim 17, wherein each source/drain region has a junction depth less than about 800 Å.

20. The method according to claim 17, wherein each source/drain region has a junction depth of about 500Å or less.

* * * * *